United States Patent [19]

Kaiser

[11] Patent Number: 5,053,352
[45] Date of Patent: Oct. 1, 1991

[54] METHOD OF FORMING AN INTEGRATED CIRCUIT WITH PN-JUNCTION CAPACITOR

[75] Inventor: Reinhold Kaiser, Heilbronn, Fed. Rep. of Germany

[73] Assignee: Telefunken electronic GmbH, Heilbronn, Fed. Rep. of Germany

[21] Appl. No.: 447,849

[22] Filed: Dec. 8, 1989

Related U.S. Application Data

[62] Division of Ser. No. 266,081, Nov. 2, 1988, Pat. No. 4,996,569.

[30] Foreign Application Priority Data

Nov. 27, 1987 [DE] Fed. Rep. of Germany ....... 3740302

[51] Int. Cl.⁵ ............................................. H01L 21/70
[52] U.S. Cl. ......................................... 437/47; 437/27;
437/52; 437/60; 437/74; 437/919
[58] Field of Search ................... 437/47, 51, 52, 74,
437/60, 54, 59, 919, 27; 357/51, 23.6

[56] References Cited

U.S. PATENT DOCUMENTS

| 3,581,164 | 5/1971 | Pfander | 437/919 |
| 3,584,266 | 5/1969 | Schilling . | |
| 3,962,718 | 6/1976 | Inoue et al. . | |
| 3,975,818 | 8/1976 | Kaji et al. | 437/919 |
| 4,377,029 | 5/1983 | Ozawa | 437/919 |
| 4,413,401 | 8/1983 | Klein et al. | 437/919 |
| 4,507,159 | 5/1985 | Erb | 437/919 |

FOREIGN PATENT DOCUMENTS

| 1764398 | 2/1971 | Fed. Rep. of Germany . |
| 2349986 | 5/1974 | Fed. Rep. of Germany . |
| 2829212 | 1/1980 | Fed. Rep. of Germany . |

OTHER PUBLICATIONS

IBM Technical Disclosure Bulletin, vol. 21, No. 3 Aug. 1978 "High Capacitance Device".

Primary Examiner—Brian E. Hearn
Assistant Examiner—Tom Thomas
Attorney, Agent, or Firm—Spencer & Frank

[57] ABSTRACT

In a method of forming an integrated circuit array having a capacitance formed by a pn-junction and separated from other components by a pn-junction, semiconductor areas are provided which connect that zone of the two semiconductor zones forming the pn-junction of the capacitance that extends deeper into the semiconductor element than the other of the two semiconductor zones forming the pn-junction of the capacitance electrically to that zone of the two semiconductor zones forming the separating pn-junction that faces away from the capacitance.

11 Claims, 2 Drawing Sheets

METHOD OF FORMING AN INTEGRATED CIRCUIT WITH PN-JUNCTION CAPACITOR

BACKGROUND OF THE INVENTION

This is a divisional application of Ser. No. 266,081 filed Nov. 2, 1988, now U.S. Pat. No. 4,996,569.

The invention relates to an integrated circuit array having a capacitance formed by a pn-junction and separated from other components by a pn-junction.

It is known that integrated circuit arrays require capacitances. Such capacitances are achieved by, for example, pn-junctions. The capacitances must have a high quality so that they are suitable for a wide frequency range, for circuits with low operating currents, and for low-noise amplifiers, for example.

SUMMARY OF THE INVENTION

The object underlying the invention is to indicate an integrated circuit array in which capacitances of high quality are provided. According to the invention, there are provided, in an integrated circuit array having a capacitance formed by a pn-junction and separated from other components by a pn-junction, semiconductor areas which connect that zone of the two semiconductor zones forming the pn-junction of the capacitance that extends deeper into the semiconductor element than the other of the two semiconductor zones forming the pn-junction of the capacitance electrically to that zone of the two semiconductor zones forming the separating pn-junction that faces away from the capacitance.

BRIEF DESCRIPTION OF THE DRAWINGS

The invention will now be described in greater detail, by way of examples, with reference to the drawings, in which.

DESCRIPTION OF THE PREFERRED EMBODIMENT

Figure 1:
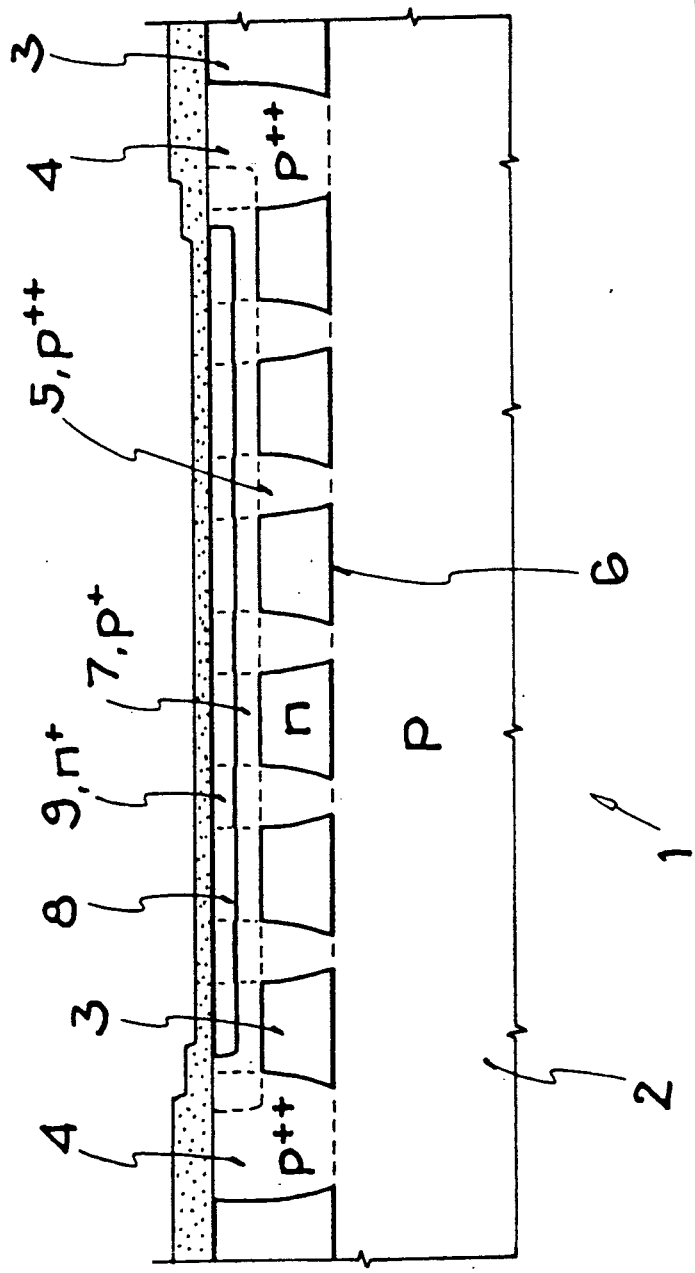
FIG. 1 shows an integrated circuit array according to the invention in section.
Figure 2:
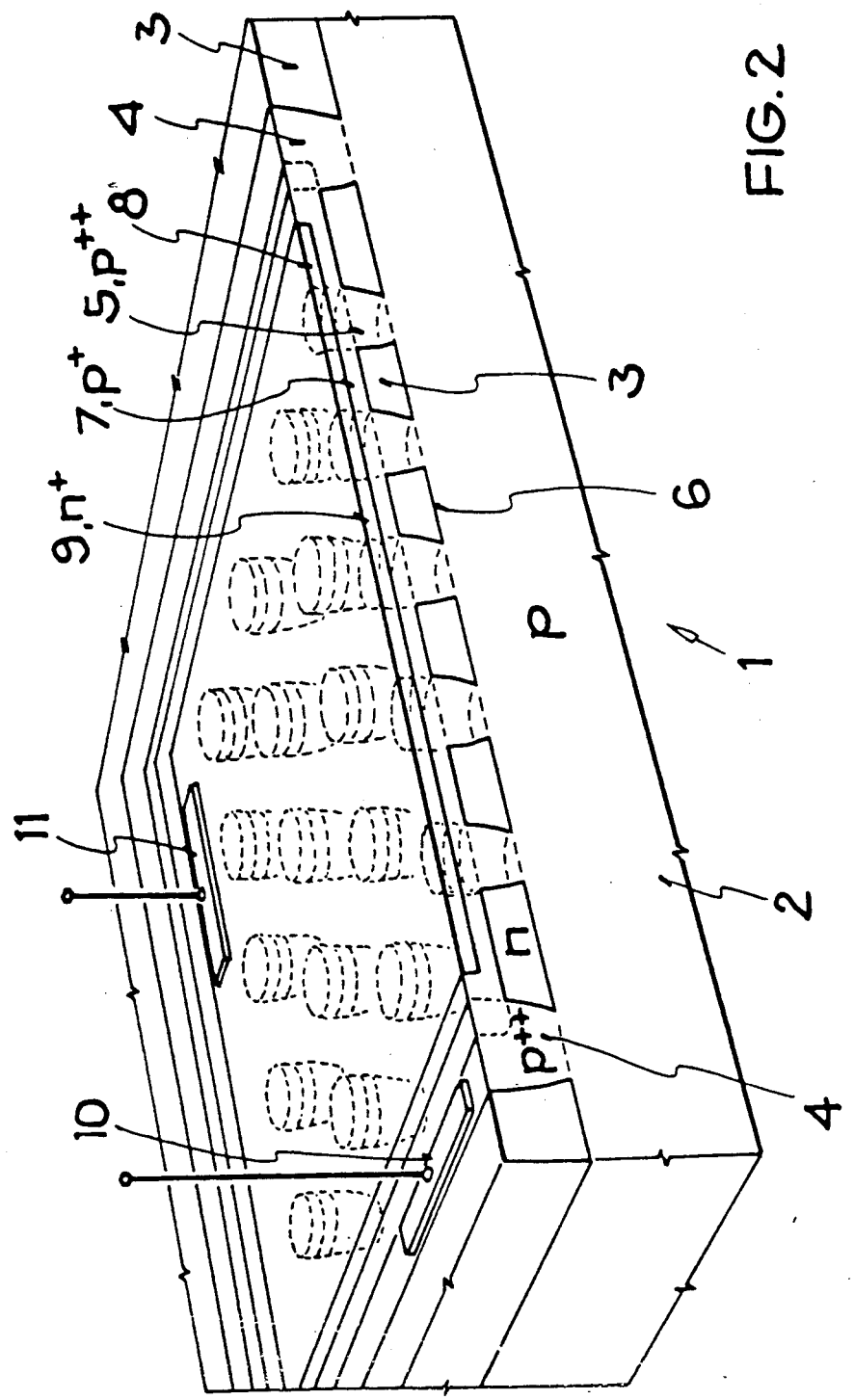
FIG. 2 shows the integrated circuit array of FIG. 1 in perspective.

FIGS. 1 and 2 show in section an integrated circuit array according to the invention, and FIG. 2 shows in addition an integrated circuit of this type in perspective. The semiconductor element 1 of the integrated circuit arrays in FIGS. 1 and 2 comprises a-substrate 2 of the first conduction type and an epitaxial layer 3 of the second conduction type.

In the embodiment according to FIGS. 1 and 2 the substrate 2 is of the p-conduction type and the epitaxial layer 3 is of the n-conduction type. For separation of the capacitance a separation zone 4 is inserted in the epitaxial layer 3 so that it surrounds the capacitance and is shaped like a frame. The separation zone 4 is of the p-conduction type in the embodiment and is form , for example, by diffusion.

Simultaneously with the manufacture of the separation zone 4, low-impedance areas 5 are inserted in the epitaxial layer in the same operation as the manufacture of the separation zone 4. If the manufacture of the low-impedance areas 5 of p-conduction type is simultaneous with the manufacture of the separation zone 4, a separate operation is not required, but the mask used to make the separation zone 4 is provided in addition with apertures for manufacture of the low-impedance areas 5. If the separation zone 4 is made by diffusion, the low-impedance areas 5 are also made by diffusion in the same operation.

The low-impedance areas 5 extend from the surface of the epitaxial layer to the separating pn-junction 6 formed by the epitaxy layer 3 and the substrate 2. The low-impedance areas have, for example, a circular or rectangular cross-section.

After manufacture of the separation zone 4 and of the low-impedance areas 5, a semiconductor zone 7 that is one of the two semiconductor zones forming the pn-junction 8 of the capacitance is inserted into the epitaxial layer 3. The semiconductor zone 7 is of the p-conduction type in the embodiment and therefore of the same conduction type as the substrates. In accordance with FIGS. 1 and 2, the semiconductor zone 9 is inserted in the semiconductor zone 7 and forms in conjunction with semiconductor zone 7 the pn-junction 8 of the capacitance. The semiconductor zones 7 and 9 are made by diffusion or by ion implantation, for example.

The low-impedance areas 5 connecting the semiconductor zone 7 electrically to the substrate 2 have a circular cross-section in the embodiment. Generally speaking however, a rectangular cross-section is preferred for design reasons. The low-impedance areas 5 are spread over the whole surface of the capacitance in accordance with the embodiment. When capacitance is mentioned here, the required capacitance is meant, and not parasitic capacitances which may still be present.

By the nature of the distribution of the low-impedance areas 5 over the surface of the capacitance and by the selection of the spacings between the low-impedance areas 5, the frequency dependency of the capacitance can be influenced. If low-impedance areas 5 are only present in a certain part of the capacitance surface, the capacitance is considerably more dependent on the frequency than if the low-impedance areas 5 are spread over the entire surface of the capacitance. The capacitance is also more dependent on frequency the greater the spacing between the low-impedance areas 5.

The low-impedance areas 5 have lower impedance in the area of the semiconductor zone 7 than that part of the semiconductor zone 7 not taken up by the low-impedance semiconductor areas 5. The low-impedance areas 5 have, for example, a sheet resistance of 20 Ohms/square unit whereas the semiconductor zone 7 underneath the semiconductor zone 9 (between the semiconductor zone 9 and the non-doped layer 3) has a sheet resistance of 5–10 kOhms/square unit.

The semiconductor zone 7 receives its potential from the substrate via the separation zone 4 or via the electrode 10 located on the surface of the semiconductor zone 7. The semiconductor zone 9 is contacted via the electrode 11.

What is claimed is:

1. In a method of producing an integrated circuit array having a capacitance formed by a first pn-junction and separated from other components by a further pn-junction, wherein the array is formed in a substrate of one conductivity type having an epitaxial layer of the opposite conductivity type formed on a surface of the substrate, and wherein the capacitance includes a first semiconductor zone of said one conductivity type formed in said epitaxial layer and extending from the surface of said epitaxial layer only partially through said epitaxial layer, a second semiconductor zone of said opposite conductivity type disposed in said first semiconductor zone at said surface of said epitaxial layer and forming said first pn-junction with said first semiconductor zone, a plurality of areas of said one conductivity type extending from said first semiconductor zone through said epitaxial layer to said substrate and electrically connecting said first semiconductor zone to said substrate, and a separation zone of said one conductivity type surrounding said first semiconductor zone at said surface of said epitaxial layer and extending through said epitaxial layer to said substrate; the improvement comprising: during a step of forming said separation zone, simultaneously forming said plurality of areas of said one conductivity type.

2. A method according to claim 1, wherein the capacitance forming said first semiconductor zone is formed in the epitaxial layer together with the base zone of transistors and the capacitance forming said second semiconductor zone is formed together with the emitter zone of transistors.

3. A method according to claim 1, wherein the separation zone and the plurality of areas making the electrically conducting connection are formed by diffusion.

4. In a method of producing a capacitance formed by a first pn-junction and separated from other components of an integrated circuit array by a further pn-junction including: providing a substrate of one conductivity type having an epitaxial layer of the opposite conductivity type formed on a surface of said substrate, forming a first semiconductor zone of said one conductivity type in said epitaxial layer so that it extends from the surface of said epitaxial layer only partially through said epitaxial layer, forming a second semiconductor zone of said opposite conductivity type in said first semiconductor zone at said surface of said epitaxial layer to form said first pn-junction with said first semiconductor zone, and forming a separation zone of said one conductivity type surrounding said first semiconductor zone at said surface of said epitaxial layer and extending through said epitaxial layer to said substrate; the improvement comprising: during said step of forming said separation zone, simultaneously forming a plurality of areas of said one conductivity type which extend through said epitaxial layer to said substrate to electrically connect said first semiconductor zone to said substrate.

5. A method as defined in claim 4 wherein said step of forming said separation zone and said plurality of areas takes place prior to said step of forming said first semiconductor zone.

6. A method of producing a capacitance formed by a first pn-junction and separated from other components of an integrated circuit array by a further pn-junction comprising the steps of:

providing a substrate of one conductivity type having an epitaxial layer of the opposite conductivity type formed on a surface of said substrate; simultaneously forming a separation zone, which is of said one conductivity type and which surrounds an area of said epitaxial layer, and a plurality of spaced areas, which are of said one conductivity type and which are distributed over said area, with said separation zone and said plurality of areas extending from the surface of said epitaxial layer through said epitaxial layer to said substrate; forming a first semiconductor zone of said one conductivity type in said area of said epitaxial layer and extending from said surface of said epitaxial layer only partially through said epitaxial layer; and forming a second semiconductor zone of said opposite conductivity type in said first semiconductor zone at said surface of said epitaxial layer to form said first pn-junction with said first semiconductor zone.

7. A method as defined in claim 6 wherein said step of simultaneously forming a separation zone and a plurality of spaced areas includes: masking said surface of said epitaxial layer to provide apertures for said separation zone and said plurality of areas; and diffusing an impurity which causes said one conductivity type into said epitaxial layer via said apertures.

8. A method as defined in claim 6 wherein said first semiconductor zone is formed such that it overlaps an inner portion of said separation zone.

9. A method as defined in claim 6 including using a higher doping concentration during said step of forming said separation zone than during said step of forming said first semiconductor zone.

10. A method as defined in claim 6 including providing said separation zone and said plurality of areas with a higher doping concentration than said substrate.

11. A method as defined in claim 6 including providing said first semiconductor zone with a higher doping concentration than said substrate.

* * * * *